(12) United States Patent
Yeh

(10) Patent No.: US 10,592,167 B2
(45) Date of Patent: Mar. 17, 2020

(54) DATA MERGE METHOD WHICH READS FIRST PHYSICAL UNIT TWICE FOR RESPECTIVELY PERFORMING FIRST STAGE PROGRAMMING OPERATION AND SECOND STAGE PROGRAMMING OPERATION ON SECOND PHYSICAL UNIT, MEMORY STORAGE DEVICE AND MEMORY CONTROL CIRCUIT UNIT

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/141,990

(22) Filed: Sep. 26, 2018

(65) Prior Publication Data
US 2020/0050399 A1 Feb. 13, 2020

(30) Foreign Application Priority Data
Aug. 9, 2018 (TW) .............................. 107127772 A

(51) Int. Cl.
*G06F 3/06* (2006.01)
(52) U.S. Cl.
CPC .......... *G06F 3/0659* (2013.01); *G06F 3/0604* (2013.01); *G06F 3/0652* (2013.01); *G06F 3/0656* (2013.01); *G06F 3/0679* (2013.01)
(58) Field of Classification Search
CPC .... G06F 3/0659; G06F 3/0679; G06F 3/0652; G06F 3/0656; G06F 3/0604

USPC .......................... 711/103, 170; 707/813, 693
See application file for complete search history.

(56) References Cited

U.S. PATENT DOCUMENTS

| | | | | |
|---|---|---|---|---|
| 2002/0073164 A1* | 6/2002 | Hagersten | ........... | G06F 12/0692 709/215 |
| 2006/0059315 A1* | 3/2006 | Moll | ................... | G06F 12/0831 711/141 |
| 2009/0276579 A1* | 11/2009 | Moyer | ................ | G06F 12/0804 711/141 |
| 2010/0306455 A1* | 12/2010 | Lee | ...................... | G06F 12/0246 711/103 |
| 2013/0024604 A1* | 1/2013 | Yeh | ...................... | G06F 12/0246 711/103 |
| 2013/0275654 A1* | 10/2013 | Chu | ..................... | G06F 12/0246 711/103 |

(Continued)

*Primary Examiner* — Hong C Kim
(74) *Attorney, Agent, or Firm* — JCIPRNET

(57) ABSTRACT

An exemplary embodiment of the disclosure provides a data merge method for a memory storage device. The method comprises: performing a data merge operation to store valid data collected from a source node comprising at least one first physical unit to a recycling node comprising a second physical unit. The data merge operation comprises: reading a first data from the at least one first physical unit by a first reading operation; performing a first stage programming operation on the second physical unit according to the first data; reading the first data from the at least one first physical unit again by a second reading operation after the first stage programming operation is performed; and performing a second stage programming operation on the second physical unit according to the first data read by the second reading operation.

21 Claims, 17 Drawing Sheets

(56) References Cited

U.S. PATENT DOCUMENTS

| | | | |
|---|---|---|---|
| 2015/0131386 A1* | 5/2015 | Yeh | G11C 16/14 |
| | | | 365/185.29 |
| 2016/0320973 A1* | 11/2016 | Yeh | G06F 3/0616 |
| 2017/0132125 A1* | 5/2017 | Cai | G06F 11/1072 |
| 2018/0143778 A1* | 5/2018 | Yeh | G06F 3/0631 |

* cited by examiner ical Field

DATA MERGE METHOD WHICH READS FIRST PHYSICAL UNIT TWICE FOR RESPECTIVELY PERFORMING FIRST STAGE PROGRAMMING OPERATION AND SECOND STAGE PROGRAMMING OPERATION ON SECOND PHYSICAL UNIT, MEMORY STORAGE DEVICE AND MEMORY CONTROL CIRCUIT UNIT

CROSS-REFERENCE TO RELATED APPLICATION

This application claims the priority benefit of Taiwan application serial no. 107127772, filed on Aug. 9, 2018. The entirety of the above-mentioned patent application is hereby incorporated by reference herein and made a part of this specification.

BACKGROUND

Technical Field

The disclosure relates to a memory technology, and more particularly, to a memory management unit, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

A rewritable non-volatile memory module may be a TLC (Triple Level Cell) NAND flash module (i.e., a flash memory module capable of storing three bits in one memory cell) or a QLC (Quad Level Cell) NAND flash module (i.e., a flash memory module capable of storing four bits in one memory cell). In the TLC NAND flash module or the QLC NAND flash module, one physical unit may be programmed a plurality times with the same write data, so as to completely store this write data. Furthermore, a plurality of programming operations for different physical units may be executed alternately. Therefore, memory storage device is always being required to equip a buffer memory with enough storage space for storing write data for multiple physical units at the same time.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

Exemplary embodiments of the disclosure provide a data merge method, a memory storage device and a memory control circuit unit which are capable of saving the usage space of a buffer memory in a data merge operation.

An exemplary embodiment of the disclosure provides a data merge method for a memory storage device comprising a plurality of physical units, the data merge method comprising: performing a data merge operation to store valid data collected from a source node to a recycling node, wherein the source node comprises at least one first physical unit among the physical units, the recycling node comprises a second physical unit among the physical units, and the data merge operation comprises: reading a first data from the at least one first physical unit by a first reading operation; performing a first stage programming operation on the second physical unit according to the first data; reading the first data from the at least one first physical unit again by a second reading operation after the first stage programming operation is performed; and performing a second stage programming operation on the second physical unit according to the first data read by the second reading operation.

An exemplary embodiment of the disclosure provides a memory storage device which comprises a connection interface unit, a rewritable non-volatile memory module and a memory control circuit unit. The connection interface unit is configured to couple to a host system. The rewritable non-volatile memory module comprises a plurality of physical units. The memory control circuit unit is coupled to the connection interface unit and the rewritable non-volatile memory module, wherein the memory control circuit unit is configured to perform a data merge operation to store valid data collected from a source node to a recycling node, wherein the source node comprises at least one first physical unit among the physical units, the recycling node comprises a second physical unit among the physical units, and the data merge operation comprises: sending a first read command sequence which instructs a reading of a first data from the at least one first physical unit by a first reading operation; sending a first write command sequence which instructs a first stage programming operation on the second physical unit according to the first data; sending a second read command sequence which instructs a reading of the first data from the at least one first physical unit again by a second reading operation after the first stage programming operation is performed; and sending a second write command sequence which instructs a second stage programming operation on the second physical unit according to the first data read by the second reading operation.

An exemplary embodiment of the disclosure provides a memory control circuit unit for controlling a rewritable non-volatile memory module which comprises a plurality of physical units, wherein the memory control circuit unit comprises a host interface, a memory interface and a memory management circuit. The host interface is configured to couple to a host system. The memory interface is configured to couple to the rewritable non-volatile memory module. The memory management circuit is coupled to the host interface and the memory interface, wherein the memory management circuit is configured to perform a data merge operation to store valid data collected from a source node to a recycling node, wherein the source node comprises at least one first physical unit among the physical units, the recycling node comprises a second physical unit among the physical units, and the data merge operation comprises: sending a first read command sequence which instructs a reading of a first data from the at least one first physical unit by a first reading operation; sending a first write command sequence which instructs a first stage programming operation on the second physical unit according to the first data; sending a second read command sequence which instructs a reading of the first data from the at least one first physical unit again by a second reading operation after the first stage programming operation is performed; and sending a second write command sequence which instructs a second stage programming operation on the second physical unit according to the first data read by the second reading operation.

Based on the above, in a data merge operation, the same data in a first physical unit may be read at least twice, so as to perform a multi stage programming operation for a second physical unit according to data read by different reading operation.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
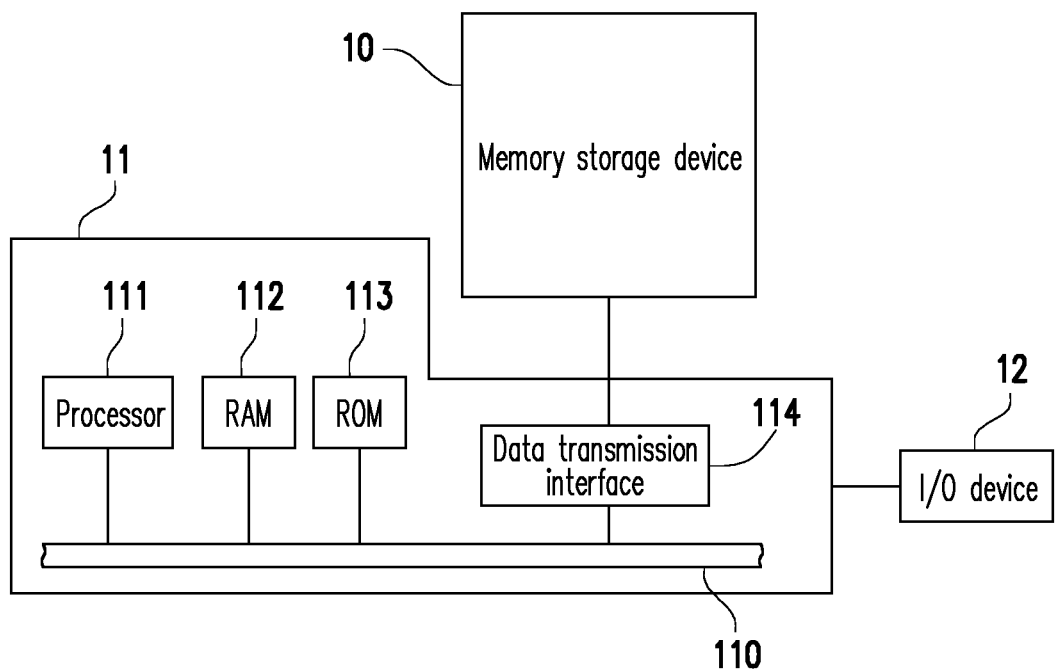
FIG. 1 is a schematic diagram illustrating a host system, a memory storage device and an I/O (input/output) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
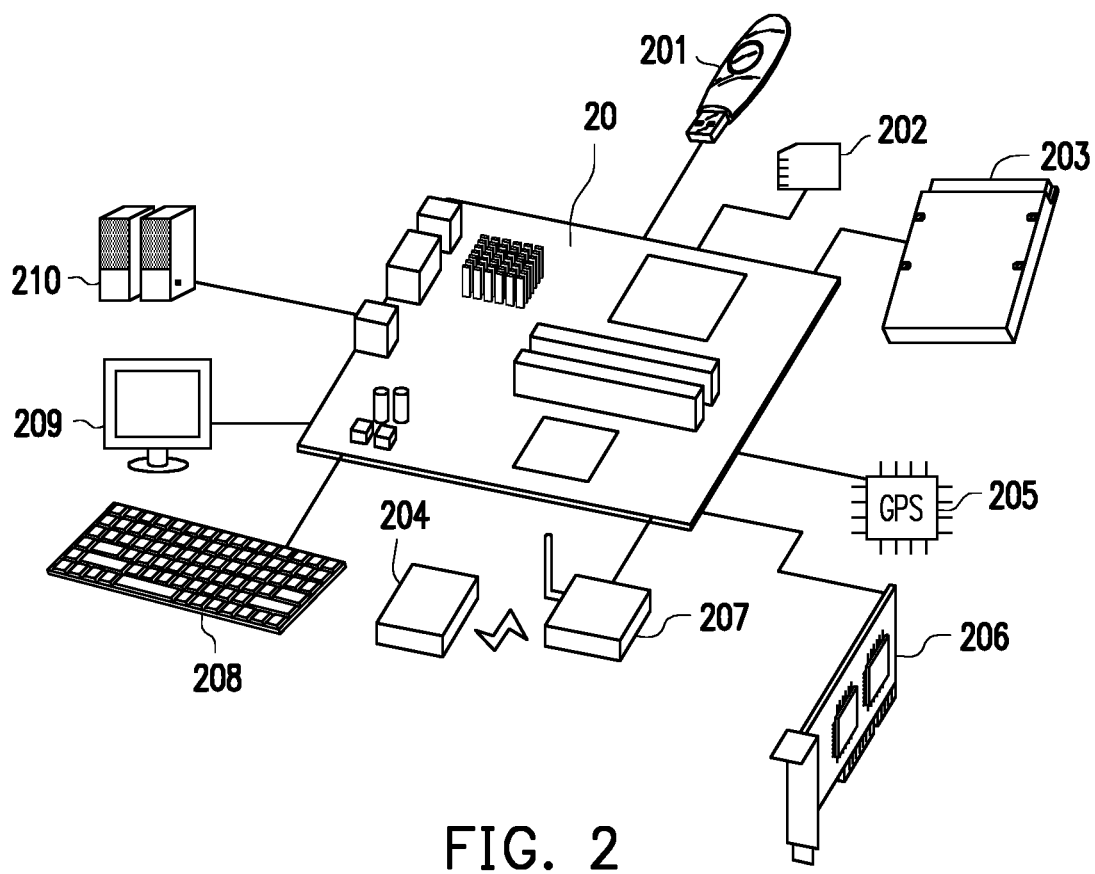
FIG. 2 is a schematic diagram illustrating a host system, a memory storage device and an I/O device according to another exemplary embodiment of the disclosure.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
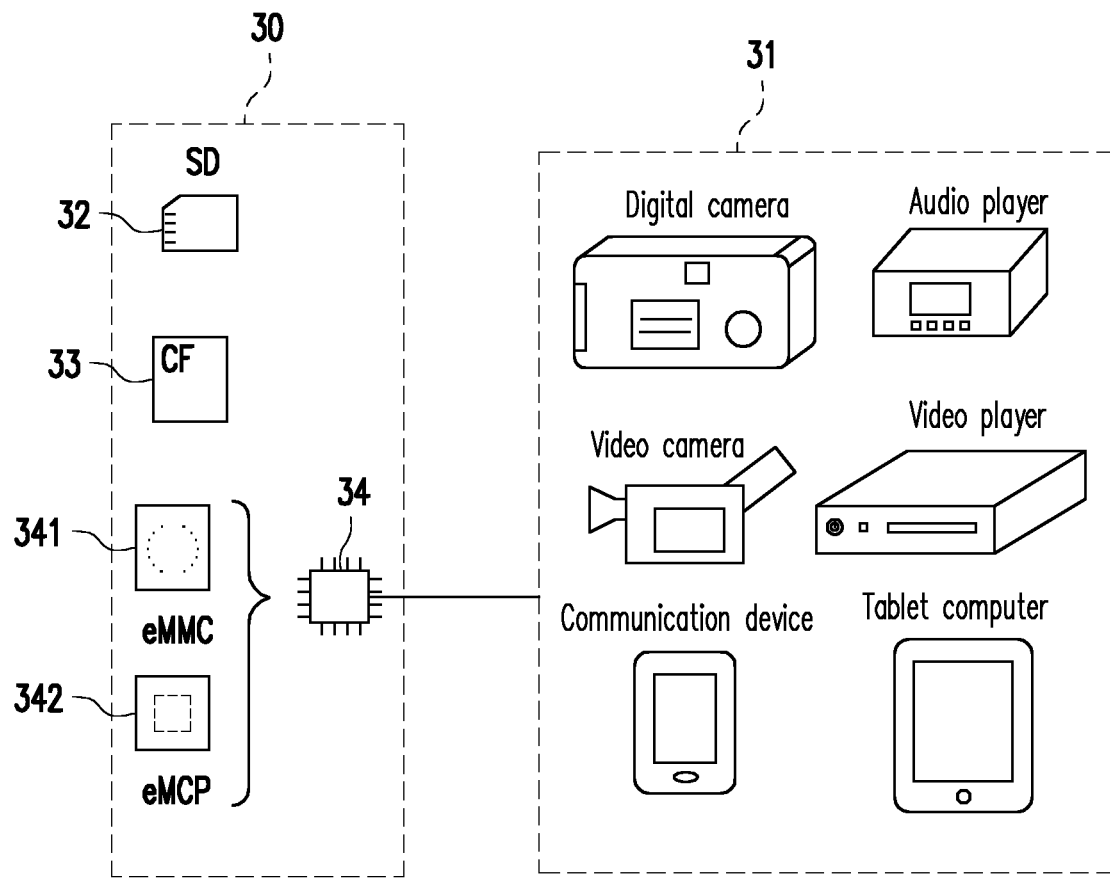
FIG. 3 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system 31, such as an eMMC (embedded Multi Media Card) 341 and/or an eMCP (embedded Multi Chip Package) storage device 342.

Figure 4:
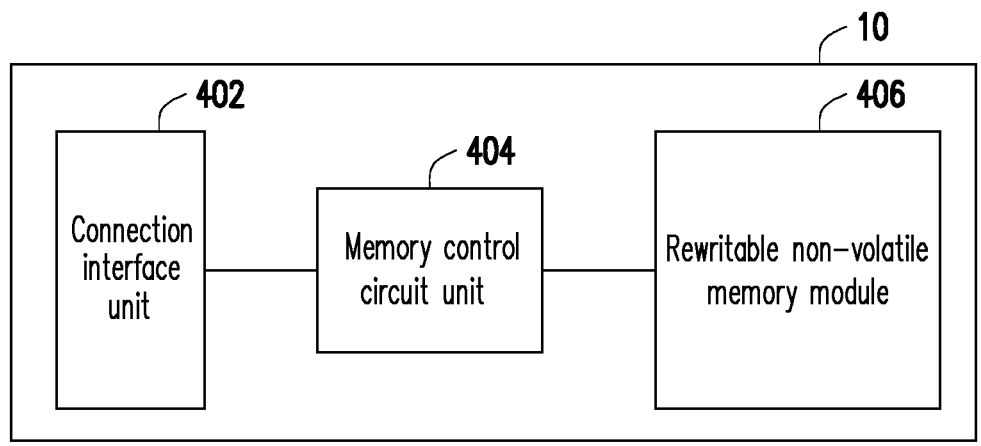
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404 and a rewritable non-volatile memory module 406.

The connection interface unit 402 is configured to couple the memory storage device 10 to the host system 11. In the present exemplary embodiment, the connection interface unit 402 is compatible with a SATA (Serial Advanced Technology Attachment) standard. Nevertheless, it should be understood that the disclosure is not limited in this regard. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quad Level Cell) NAND flash memory module (i.e., a flash memory module capable of storing four bits in one memory cell), other flash memory modules or any memory module having the same features.

The memory cells in the rewritable non-volatile memory module 406 are disposed in array. The 2-dimensional array and the 3-dimensional array are used for illustration respectively in the memory cell array of the different exemplary embodiments in the following paragraphs. It is noted that the following exemplary embodiments are merely several examples of memory cell array. In other exemplary embodiments, the configuration of the memory cell array can be adjusted to meet the practical requirements.

Figure 5A:
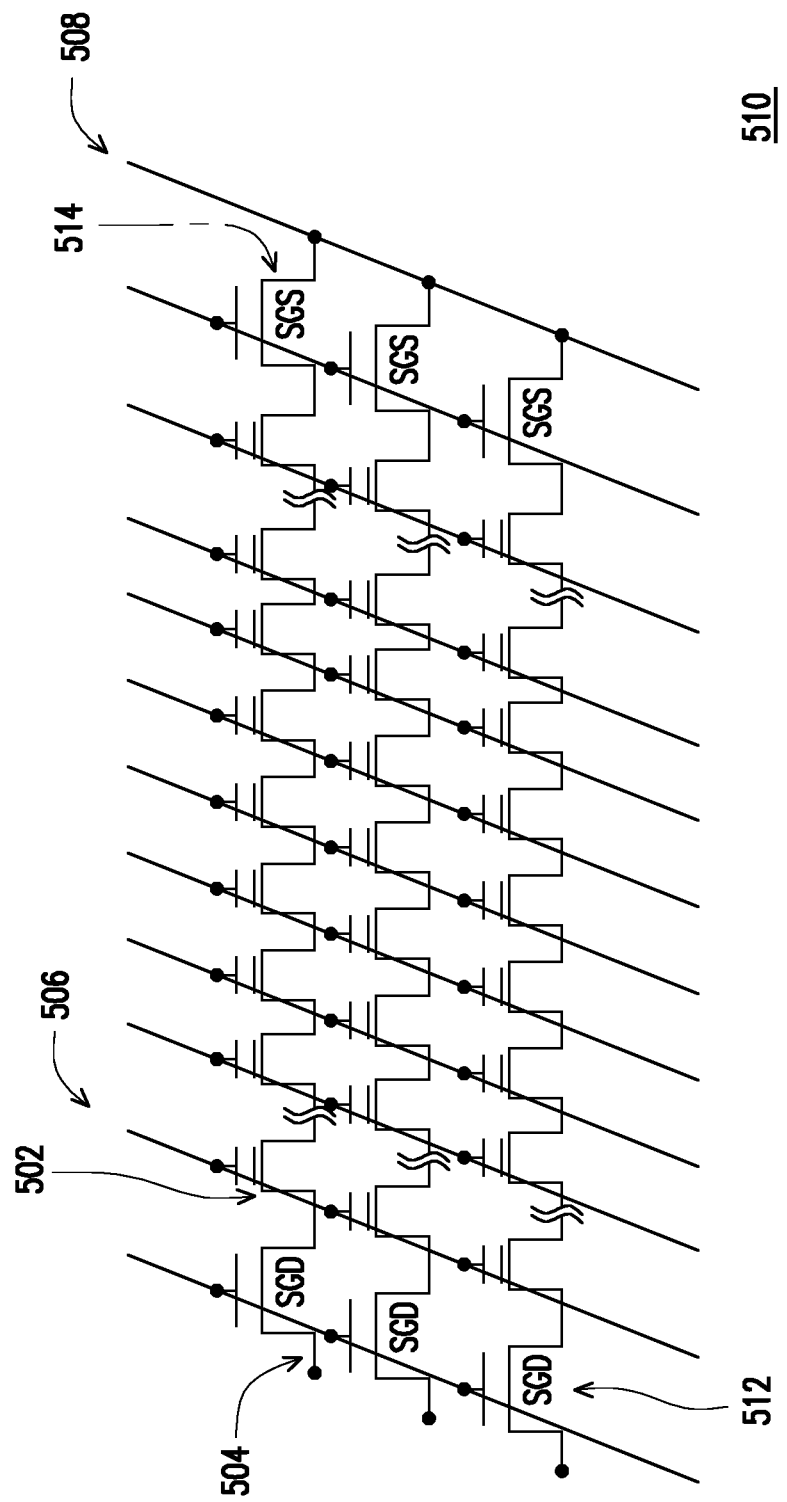
FIG. 5A is a schematic diagram illustrating a memory cell array according to an exemplary embodiment of the disclosure.

FIG. 5A is a schematic diagram illustrating a memory cell array according to an exemplary embodiment of the disclosure.

Referring to FIG. 5A, the memory cell array 510 includes a plurality of memory cells 502 for storing data, a plurality of select gate drain (SGD) transistors 512, a plurality of select gate source (SGS) transistors 514, a plurality of bit lines 504, a plurality of word lines 506, and a common source line 508 connected to the memory cells 502. The memory cells 502 are disposed on the intersections of bit lines 504 and the word lines 506 in an array, as illustrated in FIG. 5A.

Figure 5B:
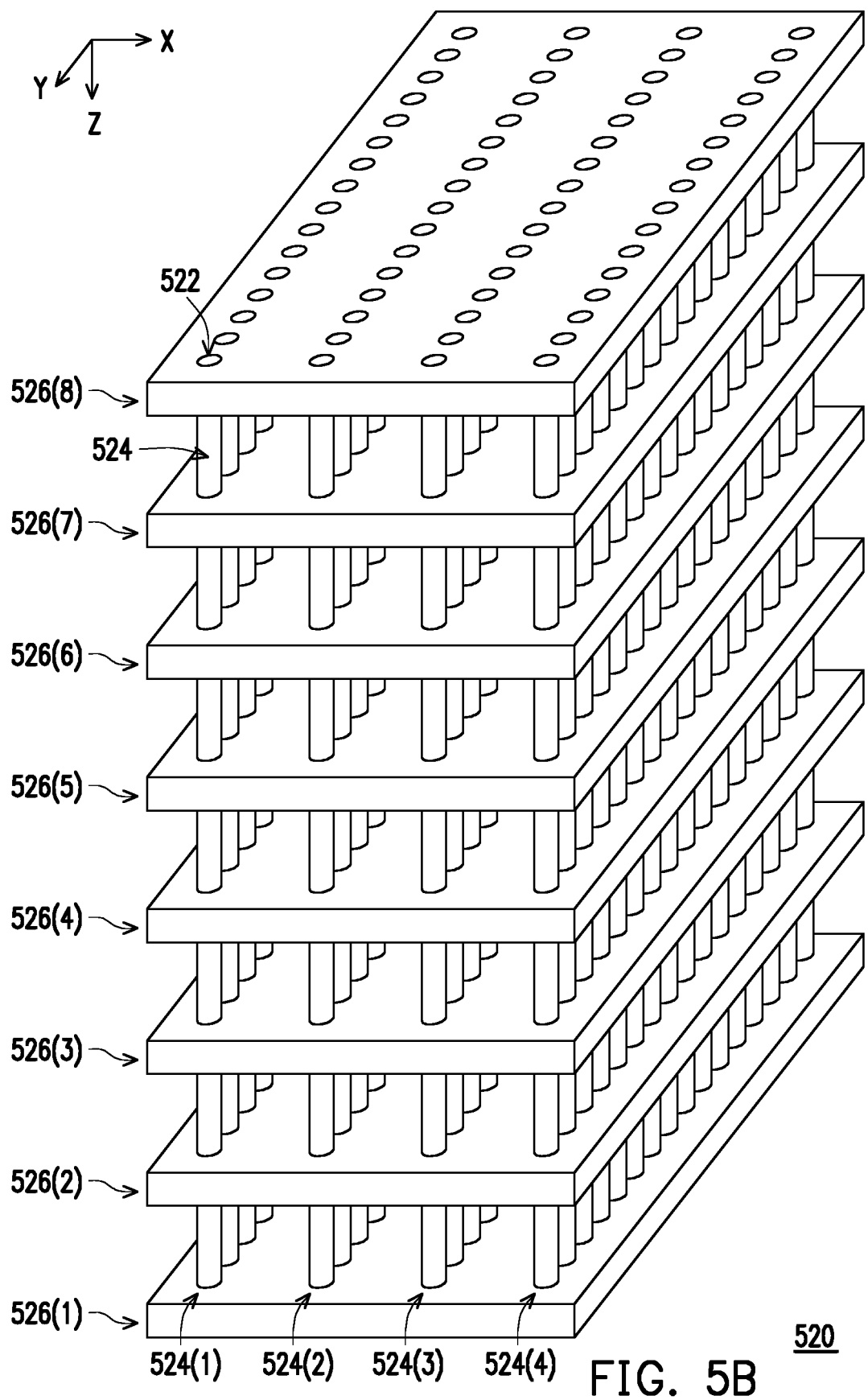
FIG. 5B is a schematic diagram illustrating a memory cell array according to an exemplary embodiment of the disclosure.

FIG. 5B is a schematic diagram illustrating a memory cell array according to an exemplary embodiment of the disclosure.

Referring to FIG. 5B, the memory cell array 520 includes a plurality of memory cells 522 for storing data, a plurality of bit line groups 524(1)~524(4), and a plurality of word line layers 526(1)~526(8). The bit line groups 524(1)~524(4) are independent from each other (for example, separated from each other) and arranged along a first direction (e.g., X-axis). Each bit line group among the bit line groups 524(1)~524(4) includes a plurality of bit line 524 independent from each other (e.g., separated from each other). The bit line 524 included in each bit line group is arranged along a second direction (e.g., Y-axis) and extended along a third direction (e.g., Z axis). Word line layers 526(1)~526(8) are independent from each other (e.g., separated from each other) and are stacked along the third direction. In the present exemplary embodiment, each word line layer of the word line layers 526(1)~526(8) can also be regarded as a word line plane. Each memory cell 522 is disposed on the intersection of each bit line 524 of the bit line groups 524(1)~524(4) and each of the word line layers 526(1)~526(8). However, in another exemplary embodiment, a bit line group can include more or less bit lines, and a word line layer can let more or less bit line groups pass by.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". By changing the threshold voltage, each of the memory cells in the rewritable non-volatile memory module 406 can have a plurality of storage states. The storage state to which the memory cell belongs may be determined by applying a read voltage to the memory cell, so as to obtain the one or more bits stored in the memory cell.

Figure 6:
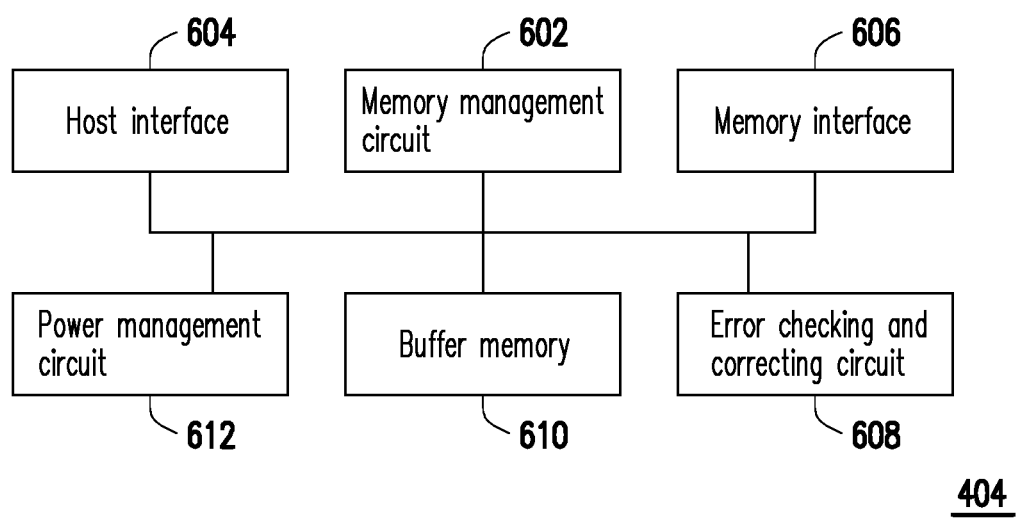
FIG. 6 is a schematic block diagram illustrating a memory control circuit unit according to an exemplary embodiment of the disclosure.

FIG. 6 is a schematic block diagram illustrating a memory control circuit unit according to an exemplary embodiment of the disclosure.

Referring to FIG. 6, the memory control circuit unit 404 includes a memory management circuit 602, a host interface 604 and a memory interface 606.

The memory management circuit 602 is configured to control overall operations of the memory control circuit unit 404. Specifically, the memory management circuit 602 has a plurality of control commands. When the memory storage device 10 operates, the control commands are executed to perform various operations such as data writing, data reading and data erasing. Hereinafter, operations of the memory management circuit 602 are described as equivalent to operations of the memory control circuit unit 404.

In the present exemplary embodiment, the control commands of the memory management circuit 602 are implemented in a firmware form. For instance, the memory management circuit 602 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 602 may also be stored as program codes in a specific area (for example, the system area in a memory exclusively used for storing system data) of the rewritable non-volatile memory module 406. In addition, the memory management circuit 602 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 602 when the memory control circuit unit 404 is enabled. Then, the control commands are executed by the microprocessor unit to perform operations, such as writing, reading or erasing data.

Further, in another exemplary embodiment, the control commands of the memory management circuit 602 may also be implemented in a form of hardware. For example, the memory management circuit 602 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and may be used to instruct the rewritable non-volatile memory module 406 to perform the corresponding operations, such as writing, reading and erasing. In an exemplary embodiment, the memory management circuit 602 may further give command sequences of other types to the rewritable non-volatile memory module 406 for instructing to perform the corresponding operations.

The host interface 604 is coupled to the memory management circuit 602 and configured to receive and identify commands and data sent from the host system 11. In other words, the commands and data transmitted by the host system 11 are transmitted to the memory management circuit 602 via the host interface 604. In this exemplary embodiment, the host interface 604 is compatible with the SATA standard. Nevertheless, it should be understood that the disclosure is not limited in this regard. The host interface 604 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 606 is coupled to the memory management circuit 602 and configured to access the rewritable non-volatile memory module 406. In other words, data to be written into the rewritable non-volatile memory module 406 is converted into a format acceptable by the rewritable non-volatile memory module 406 via the memory interface 606. Specifically, if the memory management circuit 602 intends to access the rewritable non-volatile memory module 406, the memory interface 606 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 602 and transmitted to the rewritable non-volatile memory module 406 through the memory interface 606, for example. The command sequences may include one or more signals, or data transmitted in the bus. The signals or the data may include command codes and program codes. For example, information such as identification codes and memory addresses are included in the read command sequence.

In an exemplary embodiment, the memory control circuit unit 404 further includes an error checking and correcting circuit 608, a buffer memory 610 and a power management circuit 612.

The error checking and correcting circuit 608 is coupled to the memory management circuit 602 and configured to perform an error checking and correcting operation to ensure the correctness of data. Specifically, when the memory management circuit 602 receives the write command from the host system 11, the error checking and correcting circuit 608 generates an ECC (error correcting code) and/or an EDC (error detecting code) for data corresponding to the write command, and the memory management circuit 602 writes data corresponding to the write command and the corresponding ECC and/or the EDC into the rewritable non-volatile memory module 406. Then, when the memory management circuit 602 reads the data from the rewritable non-volatile memory module 406, the corresponding ECC and/or the EDC are also read, and the error checking and correcting circuit 608 performs the error checking and correcting operation on the read data based on the ECC and/or the EDC.

The buffer memory 610 is coupled to the memory management circuit 602 and configured to temporarily store data and commands from the host system 11 or data from the rewritable non-volatile memory module 406. The power management unit 512 is coupled to the memory management circuit 602 and configured to control a power of the memory storage device 10.

In an exemplary embodiment, the rewritable non-volatile memory module 406 of FIG. 4 is also referred to as a flash memory module, the memory control circuit unit 404 is also referred to as a flash memory controller configured to control the flash memory module, and the memory management circuit 602 is also referred to as a flash memory management circuit.

Figure 7:
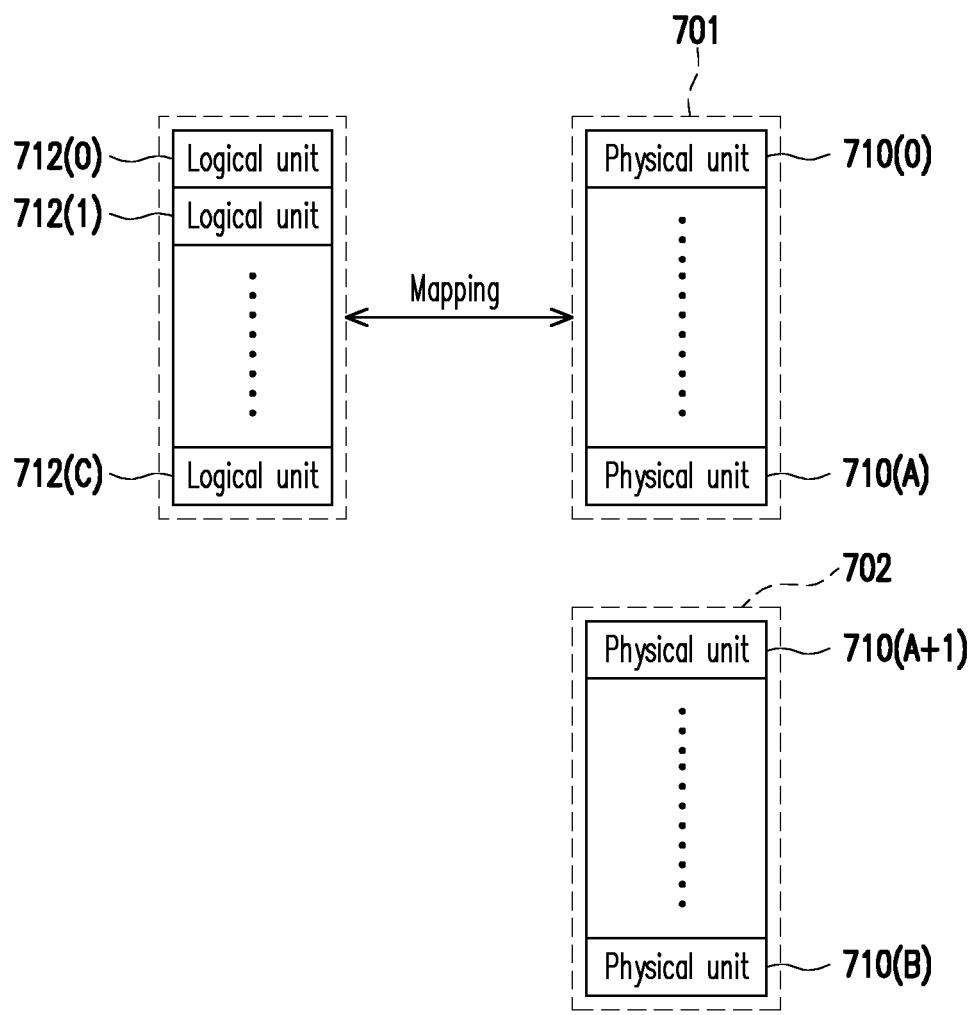
FIG. 7 is a schematic diagram illustrating management of a rewritable non-volatile memory module according to an exemplary embodiment of the disclosure.

FIG. 7 is a schematic diagram illustrating management of a rewritable non-volatile memory module according to an exemplary embodiment of the disclosure.

Referring to FIG. 7, the memory management circuit 602 logically groups physical units 710(0) to 710(B) of the rewritable non-volatile memory module 406 into a storage area 701 and a replacement area 702. The physical units 710(0) to 710(A) in the storage area 701 are configured to store data, and the physical units 710(A+1) to 710(B) in the replacement area 702 are configured to replace damaged physical units in the storage area 701. For example, if data read from one specific physical unit includes too many errors and these errors cannot be corrected, the specific physical unit is regarded as a damaged physical unit. It is noted that, if there are no available physical units in the replacement area 702, the memory management circuit 602 may declare the memory storage device 10 as in a write protect state so data can no longer be written thereto.

The memory management circuit 602 is configured to program the memory cells based on a unit of one physical unit. That is, the memory cells belong to the same physical unit may be programmed synchronously. For example, one physical unit may include the memory cells on N word lines, and N may be 4 or other integers (e.g., 2, 8, 16 and so on). In other words, one physical unit may include the memory cells on N word lines or may be constituted by the memory cells on N word lines. However, in another exemplary embodiment, one physical unit may also include more or less memory cells, which is not limited by the disclosure. In an exemplary, one physical unit may also be referred to as a layer (or a memory layer).

The memory management circuit 602 assigns logical units 712(0) to 712(C) for mapping to the physical units 710(0) to 710(A) in the storage area 701. In the present exemplary embodiment, one logical unit refers to one logical address. However, in another exemplary embodiment, one logical unit may also refer to one logical layer or a composition of a plurality of continuous or discontinuous logical addresses. In addition, each of the logical units 712(0) to 712(C) may also be mapped to one or more physical units.

The memory management circuit 602 records a mapping relation (a.k.a. a logical-physical address mapping relation) between the logical units and the physical units into at least one logical-physical address mapping table. When the host system 11 intends to read the data from the memory storage device 10 or write the data into the memory storage device 10, the memory management circuit 602 can perform a data accessing operation on the memory storage device 10 according to the logical-physical address mapping table.

It is noted that in the following description, some terms may be replaced with corresponding abbreviations for ease of reading (see Table 1).

TABLE 1

| rewritable non-volatile memory module | RNVM module |
|---|---|
| memory management circuit | MMC |
| buffer memory | BM |
| physical unit | PU |
| physical management unit | PMU |
| programming operation | PO |
| multi stage programming operation | MSPO |

In an exemplary embodiment, the MMC 602 performs a MSPO for a specific PU, so as to store data (also referred to as write data) into this specific PU. For example, the MSPO may at least include a first stage PO and a second stage PO, and the second stage PO is performed after the first stage PO. Furthermore, between the first stage PO and the second stage PO for a specific PU, other POs for another PU may be performed.

Figure 8:
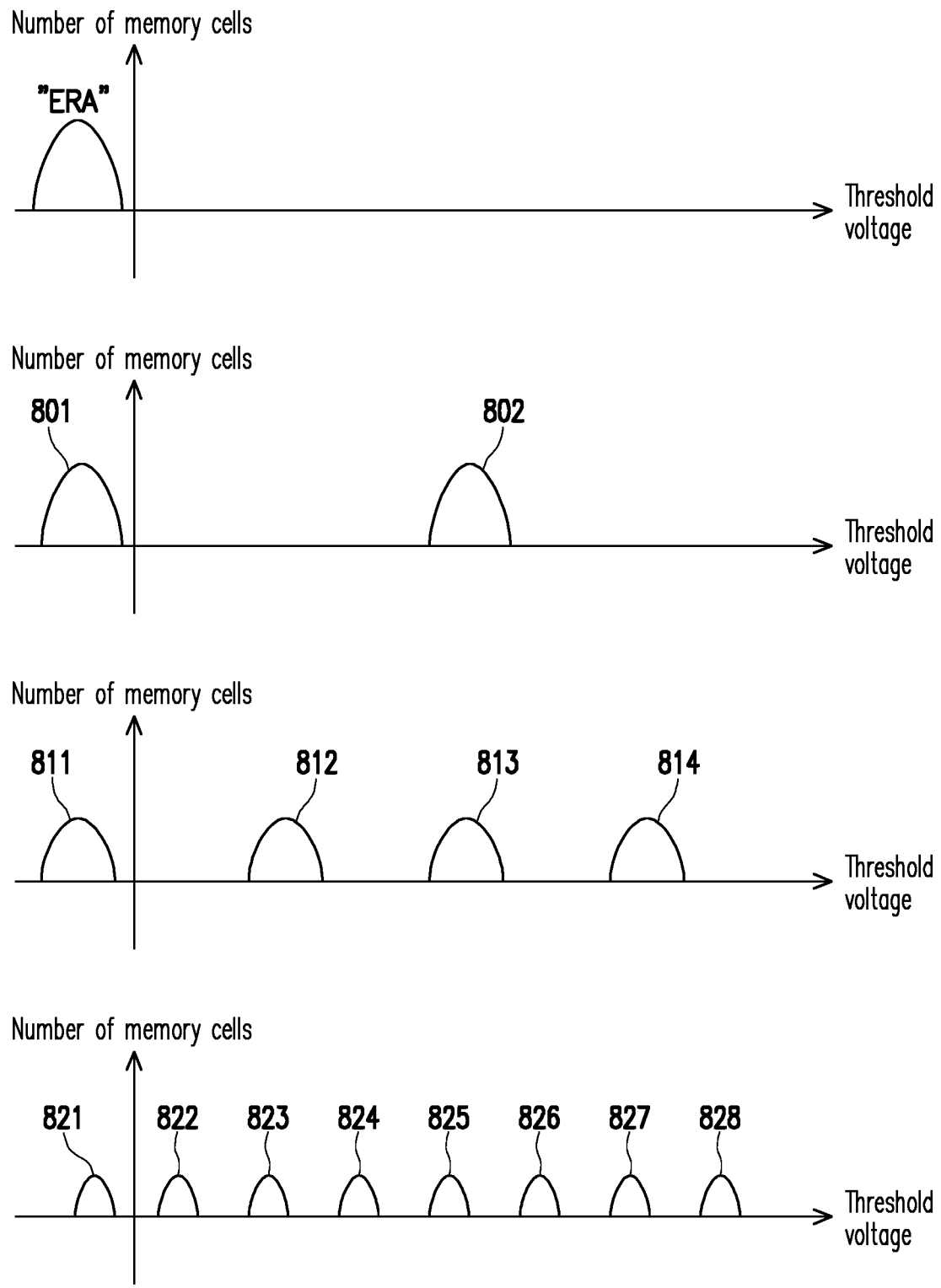
FIG. 8 is a schematic diagram illustrating programming of a physical unit according to an exemplary embodiment of the disclosure.

FIG. 8 is a schematic diagram illustrating programming of a PU according to an exemplary embodiment of the disclosure. Taking a TLC NAND flash memory module as an example, a MSPO for a specific PU is configured to program each memory cell belonging to this specific PU to a state which stores three bits.

Referring to FIG. 8, before a specific PU is programmed, memory cells in this PU is in a state of ERA. For example, after this PU is erased, the erased memory cells belong to the state of ERA. Each memory cell belonging to the state of ERA has a threshold voltage within a default voltage range (also referred to as an erase voltage range). After a PO is performed on this PU, the programmed memory cells may belong to states 801 and 802. A threshold voltage of a memory cell belonging to the state 802 is higher than a threshold voltage of a memory cell belonging to the state 801. Then, after a next PO is performed on this PU, the programmed memory cells may belong to states 811 to 814 and the threshold voltages of these memory cells are changed correspondingly. For example, a memory cell belonging to the state 811 has a lowest threshold voltage, and a memory cell belonging to the state 814 has a highest threshold voltage. Then, after a next PO is performed on this PU, the programmed memory cells may belong to states 821 to 828 and the threshold voltages of these memory cells are changed correspondingly. For example, a memory cell belonging to the state 821 has a lowest threshold voltage, and a memory cell belonging to the state 828 has a highest threshold voltage. Each memory cell belonging to one of the states 821 to 828 is configured to store three bits.

Figure 9:
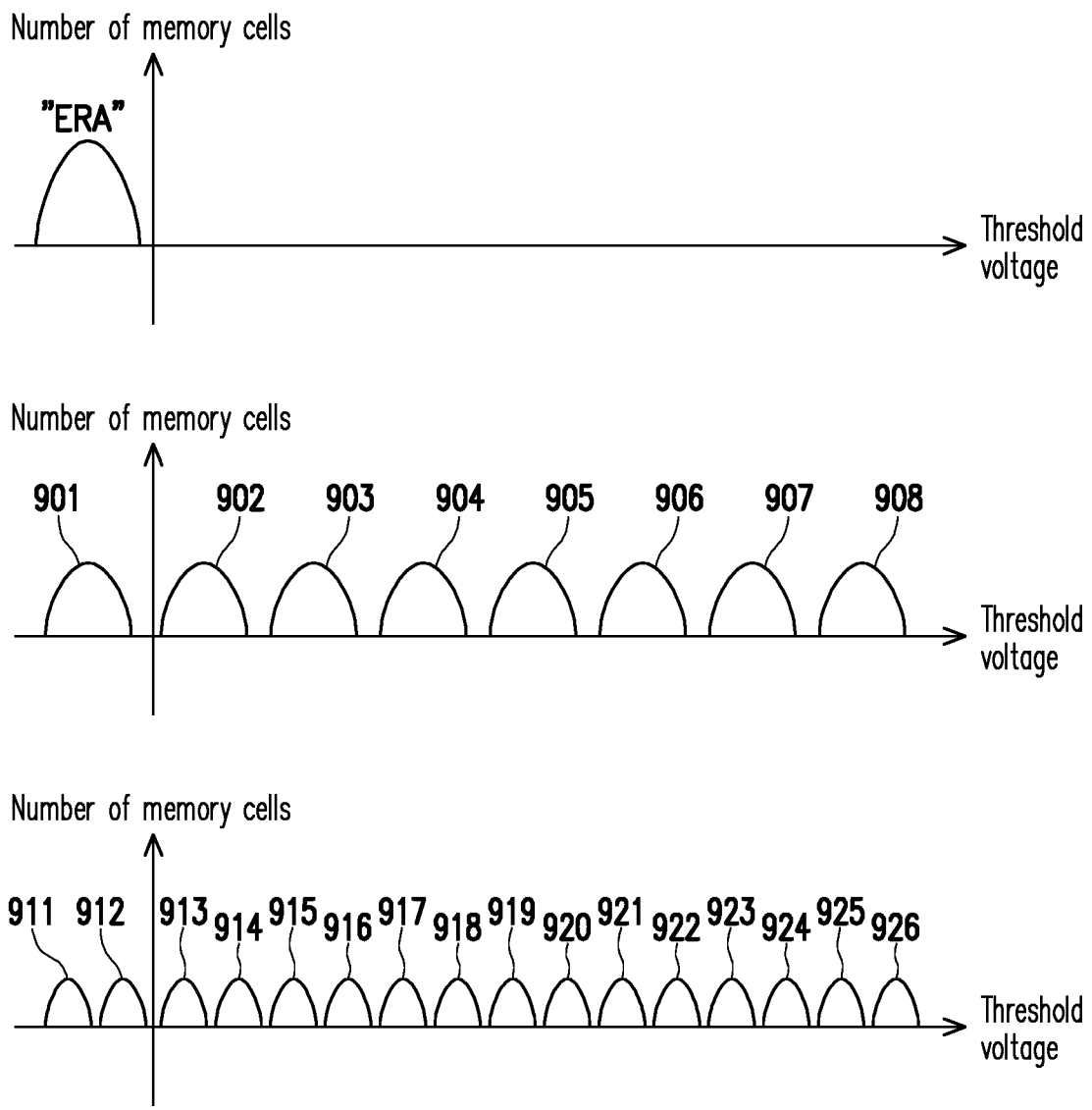
FIG. 9 is a schematic diagram illustrating programming of a physical unit according to an exemplary embodiment of the disclosure.

FIG. 9 is a schematic diagram illustrating programming of a PU according to an exemplary embodiment of the disclosure. Taking a QLC NAND flash memory module as an example, a MSPO for a specific PU is configured to program each memory cell belonging to this specific PU to a state which stores four bits.

Referring to FIG. 9 which takes a QLC NAND flash memory module as an example, before a specific PU is programmed, memory cells in this PU is in a state of ERA. After a PO is performed on this PU, the programmed memory cells may belong to states 901 to 908. For example, a threshold voltage of a memory cell belonging to the state 908 is higher than a threshold voltage of a memory cell belonging to the state 901. Then, after a next PO is performed on this PU, the programmed memory cells may belong to states 911 to 926 and the threshold voltages of these memory cells are changed correspondingly. For example, a threshold voltage of a memory cell belonging to the state 926 is higher than a threshold voltage of a memory cell belonging to the state 911. Each memory cell belonging to one of the states 911 to 926 is configured to store four bits.

In the exemplary embodiments of FIG. 8 and FIG. 9, a PO performed first may be referred to as the first stage PO, and a PO performed later may be referred to as the second stage PO. For example, in an exemplary embodiment of FIG. 8, the first stage PO is configured to program the memory cells to the state 801 and 802 (or 811 to 814), and the second stage PO is configured to program the memory cells to the state 811 to 814 (or 821 to 828). In an exemplary embodiment of FIG. 9, the first stage PO is configured to program the memory cells to the state 901 to 908, and the second stage PO is configured to program the memory cells to the state 911 to 926. It is noted that, the POs for the memory cells in different programming stage of a MSPO are not limited by the disclosure.

Figure 10:
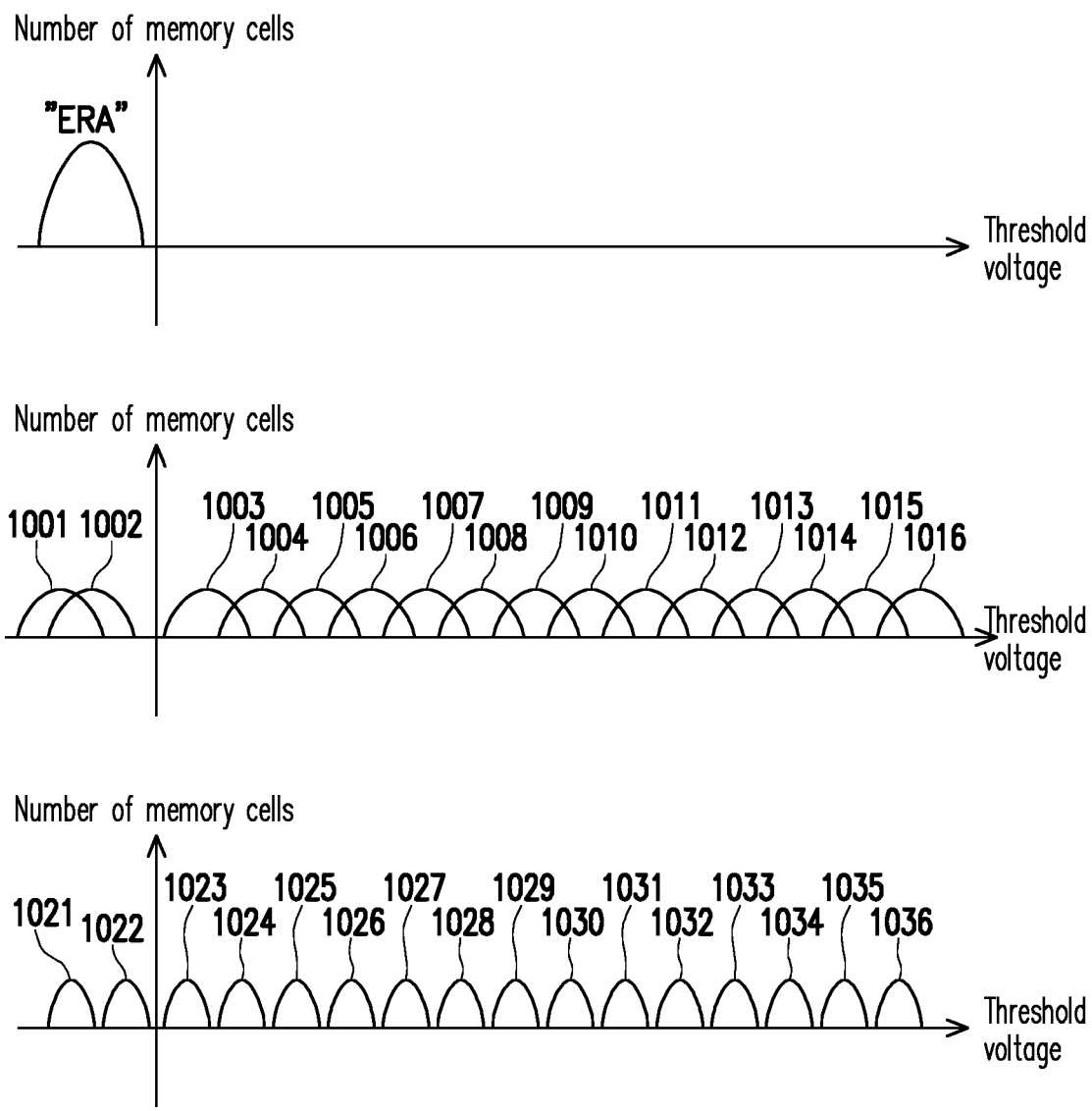
FIG. 10 is a schematic diagram illustrating programming of a physical unit according to an exemplary embodiment of the disclosure.

FIG. 10 is a schematic diagram illustrating programming of a PU according to an exemplary embodiment of the disclosure. This exemplary embodiment is also taking a QLC NAND flash memory module as an example.

Referring to FIG. 10, before a specific PU is programmed, memory cells in this PU is in a state of ERA. After a PO is performed on this PU, the programmed memory cells may belong to states 1001 to 1016. Then, after a next PO is performed on this PU, the programmed memory cells may belong to states 1021 to 1036. Each memory cell belonging to one of the states 1021 to 1036 is configured to store four bits. It is noted that, in an exemplary embodiment of FIG. 10, the first stage PO is configured to roughly adjust the threshold voltages of the memory cells. Then, in the second stage PO, the threshold voltages of the memory cells may be accurately adjusted to the voltage positions corresponding to the states of 1021 to 1036.

Figure 11:
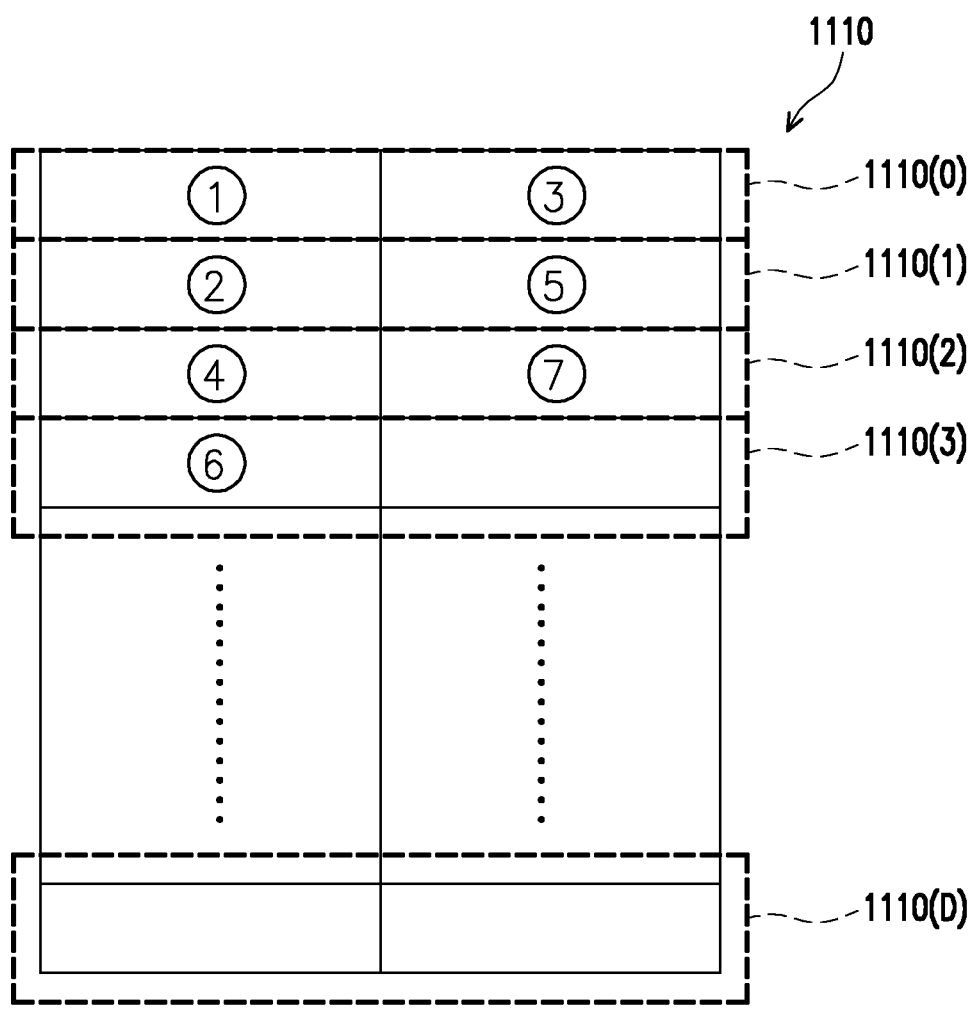
FIG. 11 is a schematic diagram illustrating programming of multiple physical units in one specific physical management unit according to an exemplary embodiment of the disclosure.

FIG. 11 is a schematic diagram illustrating programming of multiple PUs in one specific PMU according to an exemplary embodiment of the disclosure.

Referring to FIG. 11, a PMU 1110 includes a plurality of PUs 1110(0) to 1110(D). For example, D may be an integer such as 8, 16, 32 and so on. In an exemplary embodiment, the PUs 1110(0) to 1110(D) belonging to the same PMU 1110 may be erased synchronously. Furthermore, the PUs 1110(0) to 1110(D) may be programmed alternately.

In an exemplary embodiment, when data is stored into the PMU 1110, a MSPO for the PUs 1110(0) to 1110(D) may be performed sequentially based on the number marked in FIG. 11. For example, specific write data (also referred to as first data) may be temporarily stored in the BM 610 of FIG. 6 first. A first stage PO for the PU 1110(0) may be performed (corresponding to the number of 1 in FIG. 11) according to the first data in the BM 610. After the first stage PO for the PU 1110(0) is performed, another write data (also referred to as second data) may be temporarily stored in the BM 610. A first stage PO for the PU 1110(1) may be performed (corresponding to the number of 2 in FIG. 11) according to the second data in the BM 610. After the first stage PO for the PU 1110(1) is performed, a second stage programming for the PU 1110(0) may be performed (corresponding to the number of 3 in FIG. 11) according to the first data in the BM 610. It is noted that, after the second stage PO for the PU 1110(0) is performed, it may be determined that the MSPO for the PU 1110(0) is finished and the first data is stored in the PU 1110(0).

After the second stage PO for the PU 1110(0) is performed, another write data (also referred to as third data) may be temporarily stored in the BM 610 of FIG. 6. Then, a first stage PO for the PU 1110(2) may be performed (corresponding to the number of 4 in FIG. 11) according to the third data in the BM 610. After the first stage PO for the PU 1110(2) is performed, the second data may be temporarily stored in the BM 610 again. Then, a second stage programming for the PU 1110(1) may be performed (corresponding to the number of 5 in FIG. 11) according to the second data in the BM 610. It is noted that, after the second stage PO for the PU 1110(1) is performed, it may be determined that the MSPO for the PU 1110(1) is finished and the second data is stored in the PU 1110(1). Similarly, the other PUs in the PMU 1110 may be alternately programmed, so as to store other data.

In an exemplary embodiment, the available capacity of the BM 610 of FIG. 6 may be limited by the cost for building a device. For example, the designer may reduce the cost for building a device by reducing the available capacity of the BM 610. Therefore, in an exemplary embodiment, the available capacity of the BM 610 may not be enough for storing the first data and the second data at the same time. Alternatively, from another aspect, if it is assumed that each PU has a basic capacity, the available capacity of the BM 610 may be less than twice of the basic capacity. If the available capacity of the BM 610 is less than twice of the basic capacity, the available capacity of the BM 610 is not enough for storing the first data and the second data at the same time.

According to an exemplary embodiment of FIG. 11, the first data is configured to perform the MSPO for the PU 1110(0) (corresponding to the numbers of 1 and 3 in FIG. 11), and the second data is configured to perform the MSPO for the PU 1110(1) (corresponding to the numbers of 2 and 5 in FIG. 11). If the available capacity of the BM 610 is not enough for storing the first data and the second data at the same time, at least part of the first data previously stored in the BM 610 for performing the first stage PO for the PU 1110(0) (corresponding to the number of 1 in FIG. 11) may be overwritten by the second data used for performing the first stage PO for the PU 1110(1) (corresponding to the number of 2 in FIG. 11). Therefore, after the first stage PO for the PU 1110(1) (corresponding to the number of 2 in FIG. 11) is performed, the BM 610 may not store the complete first data for performing the second stage PO for the PU 1110(0) (corresponding to the number of 3 in FIG. 11).

In an exemplary embodiment of FIG. 11, after the first stage PO for the PU 1110(1) (corresponding to the number of 2 in FIG. 11) is performed, the first data may be read again and then be stored in the BM 610 temporarily. For example, if the first data is real time data from the host system 11 of FIG. 11, the first data may be received again from the host system 11. Alternatively, if the first data is read from one specific PU of the storage area 710 of FIG. 7, the first data may be read again from this specific PU. After the first data is temporarily stored in the BM 610 again, the second stage PO for the PU 1110(0) (corresponding to the number of 3 in FIG. 11) may be performed according to the first data in the BM 610. Similarly, after the first data re-read is temporarily stored in the BM 610, at least part of the second data in the BM 610 may be overwritten. Therefore, in an exemplary embodiment of FIG. 11, before the second stage PO for the PU 1110(1) (corresponding to the number of 5 in FIG. 11) is performed, the second data may be received from the host system 11 again (or read from a specific PU again) and then be temporarily stored in the BM 610. As such, the re-read second data in the BM 610 may be used in the second stage PO for the PU 1110(1).

Figure 12:
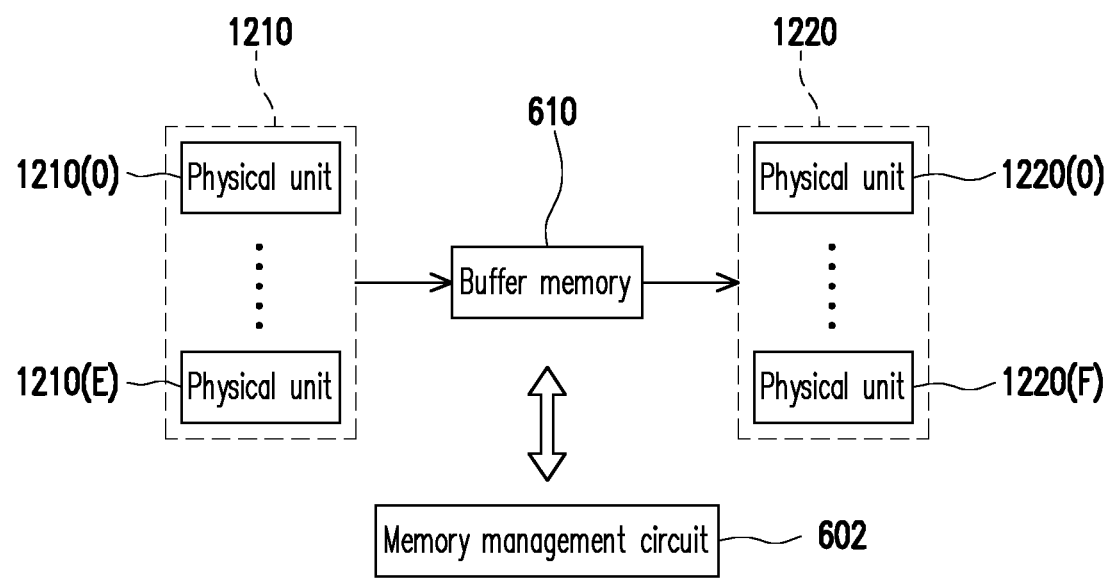
FIG. 12 is a schematic diagram illustrating a data merge operation according to an exemplary embodiment of the disclosure.

FIG. 12 is a schematic diagram illustrating a data merge operation according to an exemplary embodiment of the disclosure.

Referring to FIG. 12, at a specific time point, the MMC 602 may perform a data merge operation. For example, the specific time point may be a time point when the number of spare PUs in the storage area 701 of FIG. 7 is not enough, a time point when the memory storage device 10 of FIG. 1 is in an idle state or a time point when a preset condition is satisfied. In an exemplary embodiment, the data merge operation may also be referred to as a garbage collection operation. After the data merge operation is activated, the MMC 602 may send a read command sequence to the RNVM module 406 of FIG. 4 to instruct a reading of valid data from the PUs 1210(0) to 1210(E) served as a source node 1210. The read valid data (also referred to as the collected valid data) may be temporarily stored in the BM 610. Then, the MMC 602 may send a write command sequence to the RNVM module 406 of FIG. 4 to instruct a storing of the data (i.e., the collected valid data) in the BM 610 to the PUs 1220(0) to 1220(F) served as a recycling node (also referred to as a target node) 1220. After the valid data from a specific PU served as the source node 1210 is completely stored to the recycling node 1220, this specific PU (or a PMU including this specific PU) may be erased. For example, after the valid data from the PU 1210(0) is completely programmed to the PU 1220(0) by a MSPO, the PU 1210(0) (or a PMU including the PU 1210(0)) may be erased. The erased PU (or the erased PMU) may become a new spare PU (or a new spare PMU). In other words, new spare PU may be released by the data merge operation. Furthermore, if a specific condition is satisfied (e.g., the number of the generated spare PU is enough), the data merge operation may be stopped.

FIG. 13 to FIG. 17 are schematic diagrams illustrating a data merge operation according to an exemplary embodiment of the disclosure.

Figure 13:
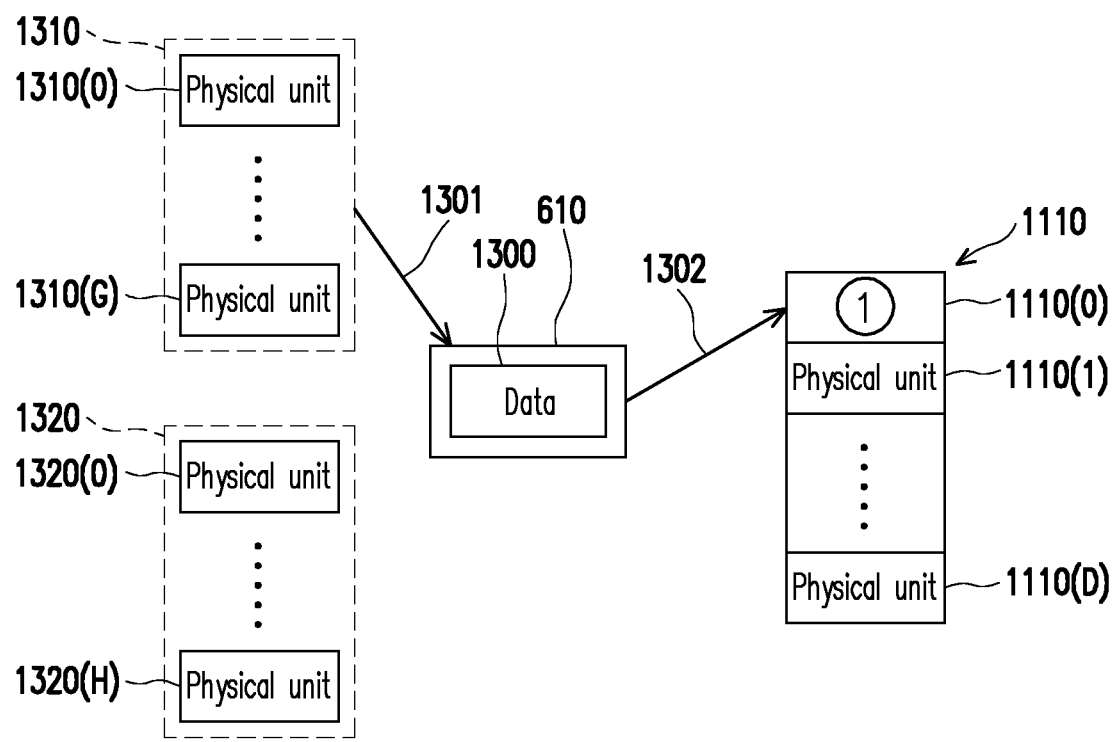
FIG. 13 to FIG. 17 are schematic diagrams illustrating a data merge operation according to an exemplary embodiment of the disclosure.

Referring to FIG. 13, it is assumed that, in the data merge operation, valid data is collected from the source nodes 1310 and 1320 and is written to the physical management physical 1110 served as the recycling node. After the data merger operation is activated, data 1300 is read, by a reading operation 1301, from at least one of the PUs 1310(0) to 1310(G) in the source node 1310 and is temporarily stored in the BM 610. A first stage PO 1302 may be performed for programming the PU 1110(0) in the PMU 1110 (corresponding to the number of 1 in FIG. 13) according to the data 1300, read by the reading operation 1301, in the BM 610.

Figure 14:
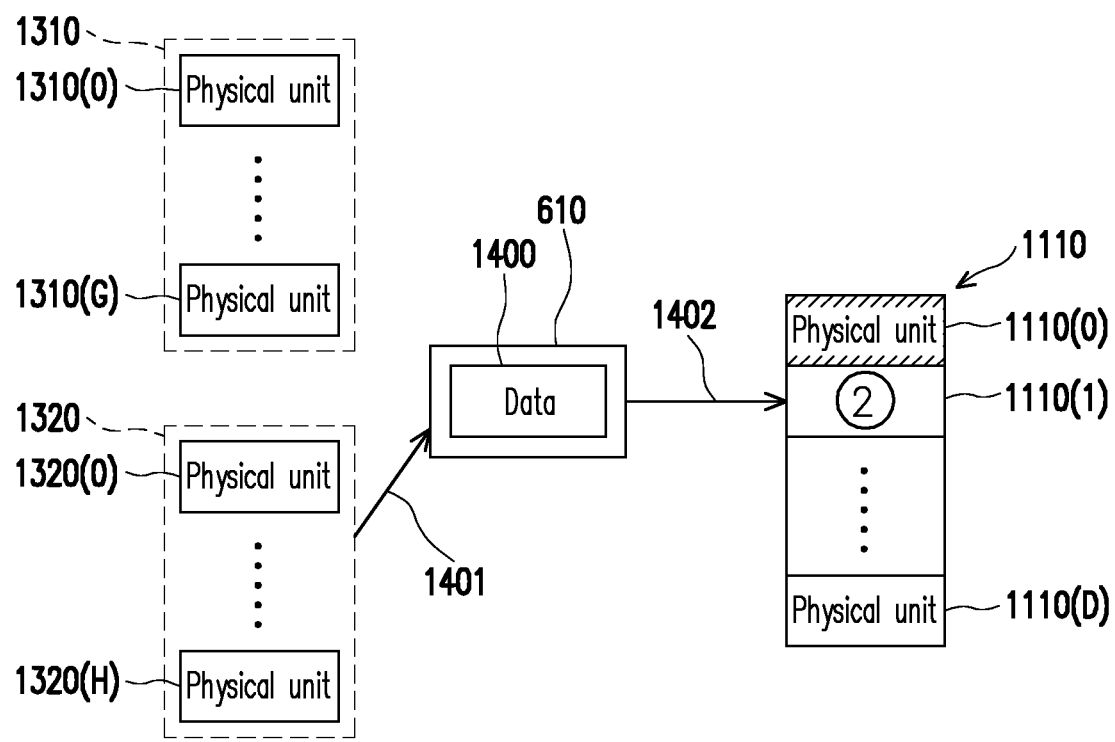

Referring to FIG. 14, the PU 1110(0) programmed by the first stage PO 1302 is marked by slash. After the first stage PO 1302 is performed, data 1400 is read, by a reading operation 1401, from at least one of the PUs 1320(0) to 1320(H) in the source node 1320 and is temporarily stored in the BM 610. For example, at least part of the data 1300 previously stored in the BM 610 may be overwritten by the data 1400. A first stage PO 1402 may be performed for programming the PU 1110(1) (corresponding to the number of 2 in FIG. 14) according to the data 1400, read by the reading operation 1401, in the BM 610.

Figure 15:
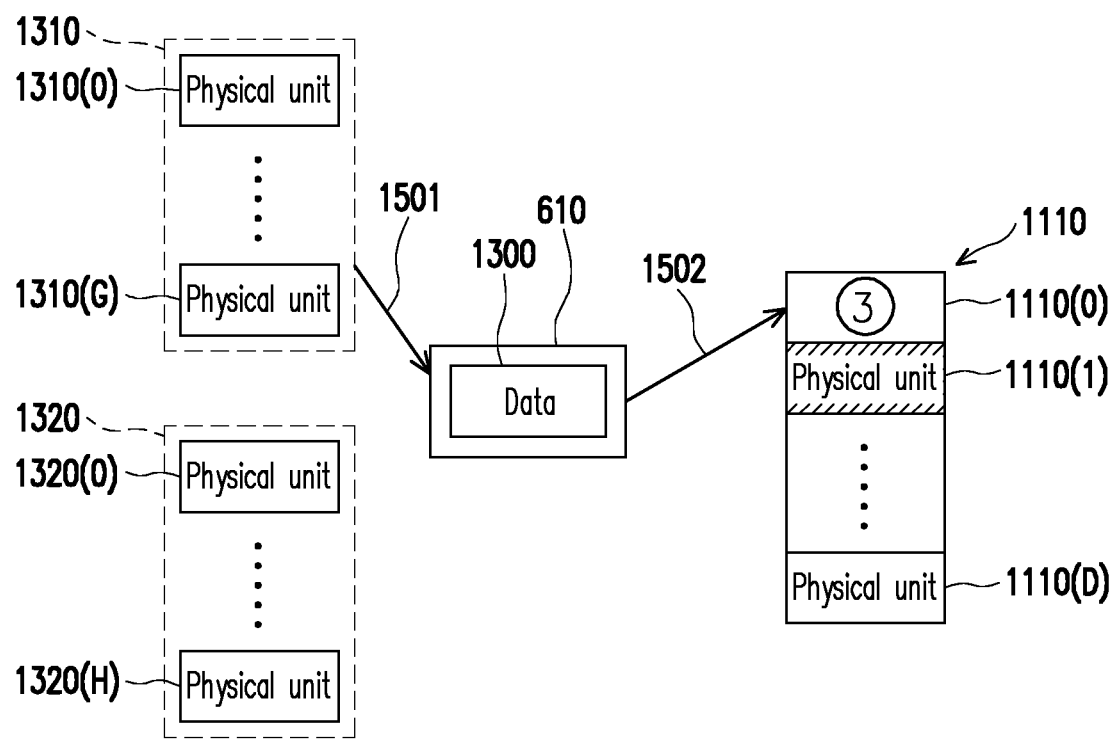

Referring to FIG. 15, the PU 1110(1) programmed by the first stage PO 1402 is marked by slash. After the first stage PO 1402 is performed, data 1300 is read again, by a reading operation 1501, from at least one of the PUs 1310(0) to 1310(G) in the source node 1310 and is temporarily stored in the BM 610. For example, at least part of the data 1400 previously stored in the BM 610 may be overwritten by the re-read data 1300. A second stage PO 1502 may be performed for programming the PU 1110(0) (corresponding to the number of 3 in FIG. 15) again according to the data 1300, read by the reading operation 1501, in the BM 610.

It is noted that, the reading operation 1301 of FIG. 13 and the reading operation 1501 of FIG. 15 are configured to read data 1300 from the same PU(s). For example, if the reading operation 1301 is configured to read the data 1300 from the PU 1310(0), then the reading operation 1501 is also configured to read the data 1300 from the same PU 1310(0). In other words, the reading operations 1301 and 1501 are configured to read the data 1300 from the same physical addresses. Alternatively, from another aspect, the data 1300 repeatedly read by the reading operations 1301 and 1501 from the same PU(s) is used for performing the MSPO for the PU 1110(0).

Figure 16:
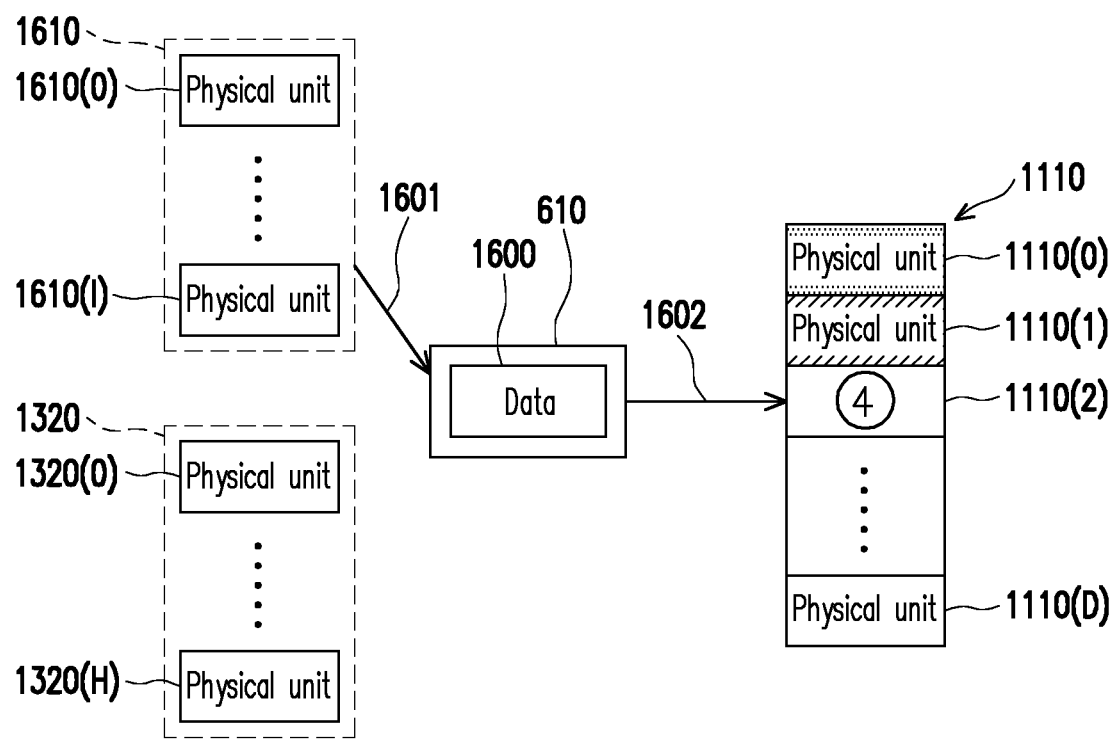

Referring to FIG. 16, the PU 1110(0) programmed by the second stage PO 1502 is marked by dots. After the second stage PO 1502 is performed, data 1600 is read, by a reading operation 1601, from at least one of PUs 1610(0) to 1610(I) in a source node 1610 and is temporarily stored in the BM 610. For example, at least part of the data 1300 previously stored in the BM 610 may be overwritten by the data 1600. A first stage PO 1602 may be performed for programming the PU 1110(2) (corresponding to the number of 4 in FIG. 16) according to the data 1600, read by the reading operation 1601, in the BM 610.

Figure 17:
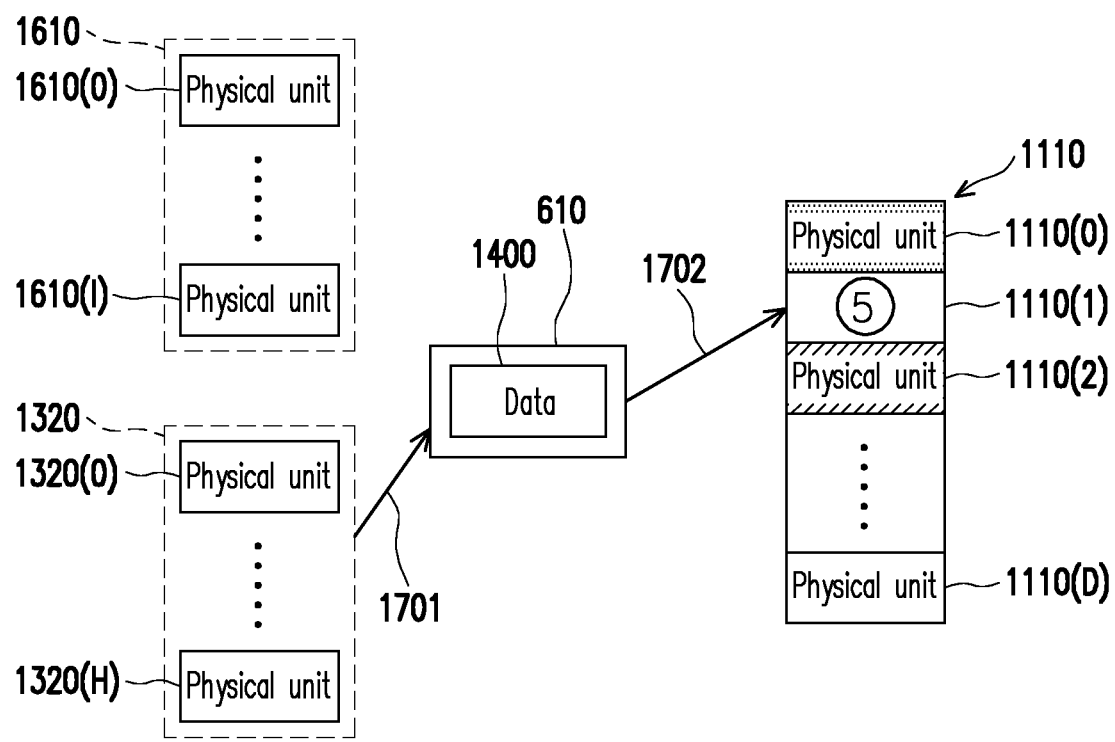

Referring to FIG. 17, the PU 1110(2) programmed by the first stage PO 1602 is marked by slash. After the first stage PO 1602 is performed, data 1400 is read again, by a reading operation 1701, from at least one of PUs 1320(0) to 1320(H) in the source node 1320 and is temporarily stored in the BM 610. For example, at least part of the data 1600 previously stored in the BM 610 may be overwritten by the re-read data 1400. A second stage PO 1702 may be performed for programming the PU 1110(1) (corresponding to the number of 5 in FIG. 17) according to the data 1400, re-read by the reading operation 1701, in the BM 610.

It is noted that, the reading operation 1401 of FIG. 14 and the reading operation 1701 of FIG. 17 are configured to read data 1400 from the same PU(s). For example, if the reading operation 1401 is configured to read the data 1400 from the PU 1320(0), then the reading operation 1701 is also configured to read the data 1400 from the same PU 1320(0). In other words, the reading operations 1401 and 1701 are configured to read the data 1400 from the same physical addresses. Alternatively, from another aspect, the data 1400 repeatedly read by the reading operations 1401 and 1701 from the same PU(s) is used for performing the MSPO for the PU 1110(1). Similarly, more valid data may be collected from the source nodes and then be stored to the PMU 1110 served as the recycling node. Furthermore, the usage of the PMU 1110 in the exemplary embodiments of FIG. 13 to FIG. 17 is the same with or similar to the usage of the PMU 1110 in the exemplary embodiment of FIG. 11.

In an exemplary embodiment, the MMC 602 is further configured to record read information related to the reading of the PUs into a management table. The read information may reflect whether a specific PU served as the source node is read by at least one reading operation (or read by a default times).

Taking an exemplary embodiment of FIG. 13 as an example, it is assumed that the read information corresponding to the PU 1310(0) in the management table is an initial read flag (e.g., a value of 0). After the data 1300 is read, by the reading operation 1301, from the PU 1310(0), the read information corresponding to the PU 1310(0) may be updated. For example, the read information corresponding to the PU 1310(0) in the management table may be updated to be a first read flag (e.g., a value of 1) which reflects that the PU 1310(0) is already read by the reading operation 1301 in the data merge operation. In an exemplary embodiment of FIG. 15, after the data 1300 is read again, by the reading operation 1501, from the PU 1310(0), the read information corresponding to the PU 1310(0) may be updated again. For example, the read information corresponding to the PU 1310(0) in the management table may be further updated to be a second read flag (e.g., a value of 2) which reflects that the PU 1310(0) is already read by the reading operation 1501 in the data merge operation. Alternatively, from another aspect, the initial read flag corresponding to the PU 1310(0) may reflect that the PU 1310(0) is not yet read in the data merge operation; the first read flag corresponding to the PU 1310(0) may reflect that the PU 1310(0) is read once in the data merge operation; and/or the second read flag corresponding to the PU 1310(0) may reflect that the PU 1310(0) is read twice in the data merge operation. Furthermore, in an exemplary embodiment, the read information corresponding to the PU 1310(0) may only include the initial read flag and the second read flag, so as to reflect whether the PU 1310(0) is read twice in the data merge operation.

In an exemplary embodiment, the MMC 602 may determine whether to erase a specific PU according to the read information corresponding to this specific PU. For example, after the data merge operation is performed, the MMC 602 may determine whether the read information corresponding to a specific PU is a second read flag. If the read information corresponding to this specific PU is the second read flag, it presents that this specific PU is read twice in the data merge operation and the MMC 602 may give an instruct to erase this specific PU. However, if he read information corresponding to this specific PU is not the second read flag, it presents that this specific PU is not read twice in the data merge operation and the MMC 602 may not erase this specific PU. For example, in an exemplary embodiment of FIG. 13, the PU 1310(0) is merely read once to provide the data 1300 used in the first stage PO 1302, and the MMC 602 does not erase the PU 1310(0) according to the read information corresponding to the PU 1310(0). In an exemplary embodiment of FIG. 15, the PU 1310(0) is read for the second times to provide the data 1300 used in the second stage PO 1502, as such the MMC 602 may erase the PU 1310(0) according to the read information corresponding to the PU 1310(0).

It is noted that, in the exemplary embodiments above, one specific memory cell being programmed by the MSPO may store 3 or 4 bits. However, in another exemplary embodiment, one specific memory cell being programmed by the MSPO may store more or less bits (e.g., 2 or 8 bits), which is not limited by the disclosure. Furthermore, one MSPO may include more stages of the POs, and not be limited to merely include the first stage PO and the second stage PO. For example, in an exemplary embodiment of FIG. 8, the executed POs may be referred to as including a first stage PO, a second stage PO and a third stage PO. The first stage PO is configured to program the memory cells to the states 801 and 802. The second stage PO is configured to program the memory cells to the states 811 to 814. The third stage PO is configured to program the memory cells to the states 821 to 828. In an exemplary embodiment, one PU may be read for more times (e.g., three times or four times), so as to perform the third stage PO and/or a fourth stage PO.

Figure 18:
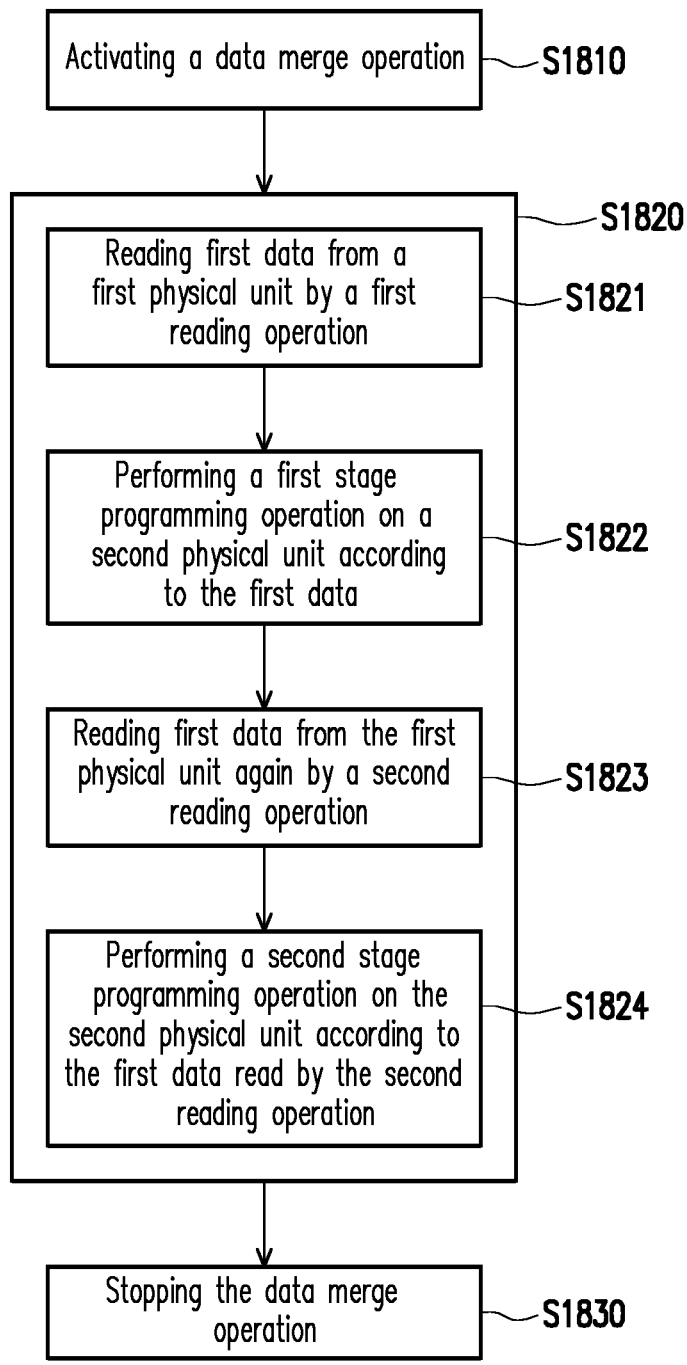
FIG. 18 is a flowchart of a data merge method according to an exemplary embodiment of the disclosure.

FIG. 18 is a flowchart of a data merge method according to an exemplary embodiment of the disclosure.

Referring to FIG. 18, in step S1810, a data merge operation is activated. In step S1820, the data merge operation is performed. The step S1820 includes steps 1821 to S1824. In step S1821, first data is read from a first PU by a first reading operation. In step S1822, a first stage PO is performed on a second PU according to the first data read by the first read operation. In step S1823, the first data is read again from the first PU by a second reading operation. In step S1824, a second stage PO is performed on the second PU according to the first data read by the second reading operation. In step S1830, stopping the data merge operation.

Nevertheless, steps depicted in FIG. 18 are described in detail as above, thus it is omitted hereinafter. It should be noted that, the steps depicted in FIG. 18 may be implemented as a plurality of program codes or circuits. The disclosure is not limited in this regard. Moreover, the method disclosed in FIG. 18 may be implemented together with above exemplary embodiments, or may be implemented separately, which are not particularly limited in the disclosure.

In summary, in the data merge operation, the same data in the first PU may be read at least twice, so as to finish the MSPO for the second PU according to the data read by different reading operations. Thereby, even the available capacity of the BM in a memory storage device is reduced due to the consideration of the building cost or other issues, the MSPO of one single PU may be finished without extra increasing the capacity of the BM. In an exemplary embodiment, the mechanism of finishing the MSPO by reading the same PU multiple times may further improve the compatibility of the memory storage device which works together with a memory controller (or a control chip) equipping a BM with less capacity.

The previously described exemplary embodiments of the present disclosure have the advantages aforementioned, wherein the advantages aforementioned not required in all versions of the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A data merge method for a memory storage device comprising a plurality of physical units, the data merge method comprising:

performing a data merge operation to store valid data collected from a source node to a recycling node, wherein the source node comprises at least one first physical unit among the physical units, the recycling node comprises a second physical unit among the physical units, and the data merge operation comprises:

reading a first data from the at least one first physical unit by a first reading operation;

performing a first stage programming operation on the second physical unit according to the first data;

reading the first data from the at least one first physical unit again by a second reading operation after the first stage programming operation is performed; and performing a second stage programming operation on the second physical unit according to the first data read by the second reading operation.

2. The data merge method of claim 1, wherein the source node further comprises at least one third physical unit among the physical units, the recycling node further comprises a fourth physical unit among the physical units, and the data merge operation further comprises:

reading a second data from the at least one third physical unit; and programming the fourth physical unit according to the second data between the first stage programming operation and the second stage programming operation.

3. The data merge method of claim 1, wherein the data merge operation further comprises:

storing the first data read by the first reading operation into a buffer memory temporarily, so as to provide the first data used in the first stage programming operation;

storing a second data into the buffer memory temporarily, wherein at least part of the first data read by the first reading operation is overwritten by the second data in the buffer memory; and storing the first data read by the second reading operation into the buffer memory temporarily, so as to provide the first data used in the second stage programming operation.

4. The data merge method of claim 1, further comprising:

recording read information in a management table, wherein the read information reflects whether the at least one first physical unit is read by at least one of the first reading operation and the second reading operation; and erasing the at least one first physical unit according to the read information.

5. The data merge method of claim 1, wherein the second physical unit is programmed by the first stage programming operation and the second stage programming operation sequentially to store the first data.

6. The data merge method of claim 1, wherein the first stage programming operation and the second stage programming operation belong to a multi stage programming operation, and at least three bits is stored in one memory cell of the second physical unit being programmed by the multi stage programming operation.

7. The data merge method of claim 1, further comprising:

storing the first data read by the first reading operation or the second reading operation in a buffer memory temporarily, wherein the second physical unit has a basic capacity, and an available capacity of the buffer memory is less than twice of the basic capacity.

8. A memory storage device, comprising:

a connection interface unit, configured to couple to a host system;

a rewritable non-volatile memory module which comprises a plurality of physical units; and a memory control circuit unit, coupled to the connection interface unit and the rewritable non-volatile memory module, wherein the memory control circuit unit is configured to perform a data merge operation to store valid data collected from a source node to a recycling node, wherein the source node comprises at least one first physical unit among the physical units, the recycling node comprises a second physical unit among the physical units, and the data merge operation comprises:

sending a first read command sequence which instructs a reading of a first data from the at least one first physical unit by a first reading operation;

sending a first write command sequence which instructs a first stage programming operation on the second physical unit according to the first data;

sending a second read command sequence which instructs a reading of the first data from the at least one first physical unit again by a second reading operation after the first stage programming operation is performed; and sending a second write command sequence which instructs a second stage programming operation on the second physical unit according to the first data read by the second reading operation.

9. The memory storage device of claim 8, wherein the source node further comprises at least one third physical unit among the physical units, the recycling node further comprises a fourth physical unit among the physical units, and the data merge operation further comprises:

sending a third read command sequence which instructs a reading of a second data from the at least one third physical unit; and sending a third write command sequence which instructs a programming of the fourth physical unit according to the second data between the first stage programming operation and the second stage programming operation.

10. The memory storage device of claim 8, wherein the data merge operation further comprises:

storing the first data read by the first reading operation into a buffer memory temporarily, so as to provide the first data used in the first stage programming operation;

storing a second data into the buffer memory temporarily, wherein at least part of the first data read by the first reading operation is overwritten by the second data in the buffer memory; and storing the first data read by the second reading operation into the buffer memory temporarily, so as to provide the first data used in the second stage programming operation.

11. The memory storage device of claim 8, wherein the memory control circuit unit is further configured to record read information in a management table and erase the at least one first physical unit according to the read information, and the read information reflects whether the at least one first physical unit is read by at least one of the first reading operation and the second reading operation.

12. The memory storage device of claim 8, wherein the second physical unit is programmed by the first stage programming operation and the second stage programming operation sequentially to store the first data.

13. The memory storage device of claim 8, wherein the first stage programming operation and the second stage programming operation belong to a multi stage programming operation, and at least three bits is stored in one memory cell of the second physical unit being programmed by the multi stage programming operation.

14. The memory storage device of claim 8, wherein the memory control circuit unit is further configured to store the first data read by the first reading operation or the second reading operation in a buffer memory temporarily, wherein the second physical unit has a basic capacity, and an available capacity of the buffer memory is less than twice of the basic capacity.

15. A memory control circuit unit for controlling a rewritable non-volatile memory module which comprises a plurality of physical units, wherein the memory control circuit unit comprises:

a host interface configured to couple to a host system;

a memory interface, configured to couple to the rewritable non-volatile memory module; and a memory management circuit, coupled to the host interface and the memory interface, wherein the memory management circuit is configured to perform a data merge operation to store valid data collected from a source node to a recycling node, wherein the source node comprises at least one first physical unit among the physical units, the recycling node comprises a second physical unit among the physical units, and the data merge operation comprises:

sending a first read command sequence which instructs a reading of a first data from the at least one first physical unit by a first reading operation;

sending a first write command sequence which instructs a first stage programming operation on the second physical unit according to the first data;

sending a second read command sequence which instructs a reading of the first data from the at least one first physical unit again by a second reading operation after the first stage programming operation is performed; and sending a second write command sequence which instructs a second stage programming operation on the second physical unit according to the first data read by the second reading operation.

16. The memory control circuit unit of claim 15, wherein the source node further comprises at least one third physical unit among the physical units, the recycling node further comprises a fourth physical unit among the physical units, and the data merge operation further comprises:

sending a third read command sequence which instructs a reading of a second data from the at least one third physical unit; and sending a third write command sequence which instructs a programming of the fourth physical unit according to the second data between the first stage programming operation and the second stage programming operation.

17. The memory control circuit unit of claim 15, wherein the memory control circuit unit further comprises a buffer memory coupled to the memory management circuit, and the data merge operation further comprises:

storing the first data read by the first reading operation into the buffer memory temporarily, so as to provide the first data used in the first stage programming operation;

storing a second data into the buffer memory temporarily, wherein at least part of the first data read by the first reading operation is overwritten by the second data in the buffer memory; and storing the first data read by the second reading operation into the buffer memory temporarily, so as to provide the first data used in the second stage programming operation.

18. The memory control circuit unit of claim 15, wherein the memory management circuit is further configured to record read information in a management table and erase the at least one first physical unit according to the read information, and the read information reflects whether the at least one first physical unit is read by at least one of the first reading operation and the second reading operation.

19. The memory control circuit unit of claim 15, wherein the second physical unit is programmed by the first stage programming operation and the second stage programming operation sequentially to store the first data.

20. The memory control circuit unit of claim 15, wherein the first stage programming operation and the second stage programming operation belong to a multi stage programming operation, and at least three bits is stored in one memory cell of the second physical unit being programmed by the multi stage programming operation.

21. The memory control circuit unit of claim 15, wherein the memory control circuit unit further comprises a buffer memory coupled to the memory management circuit, and the memory management circuit is further configured to store the first data read by the first reading operation or the second reading operation in the buffer memory temporarily, wherein the second physical unit has a basic capacity, and an available capacity of the buffer memory is less than twice of the basic capacity.

* * * * *